United States Patent [19]

Saxena et al.

[11] 4,057,460
[45] Nov. 8, 1977

[54] PLASMA ETCHING PROCESS

[75] Inventors: Arjun N. Saxena, Palo Alto; Courtney Hart, San Jose, both of Calif.

[73] Assignee: Data General Corporation, Westboro, Mass.

[21] Appl. No.: 743,734

[22] Filed: Nov. 22, 1976

[51] Int. Cl.² .................................................. C23F 1/02
[52] U.S. Cl. ................................... 156/643; 156/646; 156/656; 156/659; 204/192 E
[58] Field of Search ............... 156/643, 646, 650–652, 156/654–656, 659, 664, 665; 204/192 EC, 192 E

[56] References Cited

U.S. PATENT DOCUMENTS 3,795,557 3/1974 Jacob ...................................... 156/646
3,984,300 10/1976 VanOmmeren ....................... 204/192

OTHER PUBLICATIONS

IBM Technical Disclosure Bulletin, vol. 13, No. 4, Sept. 1970, Sputter Etching Process by W. E. Mutler, p. 884.

Primary Examiner—William A. Powell
Attorney, Agent, or Firm—Joel Wall; Jacob Frank

[57] ABSTRACT

An improved plasma etching process. There is disclosed apparatus and method (or process) for etching patterns in metal films deposited on a semiconductor wafer. This improved process is particularly useful in the fabrication of certain semiconductor devices, such as MOS and bipolar integrated circuits and Schottky transistors (semiconductor/metal interfaces) which employ contact "fingers". The fingers are constructed from layers of metal, such as aluminum, tungsten, and titanium with aluminum being the outermost layer.

7 Claims, 3 Drawing Figures

PLASMA ETCHING PROCESS

BACKGROUND OF THE INVENTION

1. Field of the Invention

The present invention relates generally to an improved plasma etching process for etching patterns in metal films, and more particularly to a process for aiding in the fabrication of MOS and bipolar integrated circuits and Schottky devices such as Schottky transistors.

2. Description of the Prior Art

Examples of patents which relate to etching patterns in metal films or to formation of Schottky barriers by use of a plasma are U.S. Pat. No. 3,795,557, issued Mar. 5, 1974 to A. Jacob, and U.S. Pat. No. 3,879,597, issued Apr. 22, 1975 to Bersin, et al; disclosures of these two patents are incorporated herein by reference.

Metal-semiconductor rectifying devices have been investigated since the late 1800's. Sometime thereafter, around the turn of the century, a point-contact rectifier (metal-semiconductor junction device) may have found practical utility as evidenced by U.S. Pat. No. 775,840, issued in 1904 to J. C. Bose. In the late 1930's W. Schottky continued to study the metal-semiconductor potential barrier, and the suggestion that this potential barrier could arise from arrangement of space charges within the semiconductor, not necessarily requiring presence of an adjacent chemical layer, is attributed to him. This development continued through more recent history, and the metal-semiconductor junction rectifier presently employed in electronic circuit applications is commonly called a Schottky diode or Schottky transistor.

The Schottky barrier contact or interface, as noted, is a rectifying metal-semiconductor junction. Such Schottky barrier contacts utilize the Schottky effect based upon rectification characteristics exhibited by well known metal-semiconductor interfaces. Generally, electrical characteristics of these contacts depend upon what is termed "work function" of the metal, as well as electron affinity in the semiconductor material. The work function is generally defined as minimum energy necessary for an electron to have in order to escape into vacuum from initial energy at the Fermi level, in a metal-vacuum system. In other words, in a metal, the Fermi level is an energy reference level from which an electron is removed to the free state (vacuum electron) by an amount of energy equal to the work function.

Fabrication of these Schottky barriers has been subject to various improvements over a period of time. Presently, plasma etching is employed in the fabrication of these semiconductor devices, as well as others.

In plasma etching of patterns in metal films on a semiconductor substrate (these metal films being used in Schottky devices and for interconnecting various regions within integrated circuits), a variety of metals can be processed. For one example, a metal film layer can be comprised of a base layer of titanium, with another layer of tungsten thereon, and beyond that, a top layer of aluminum.

In the prior art, the desired pattern is etched first in aluminum by using conventional photolithography and chemical etching techniques. In this prior art approach, the photoresist layer is then removed prior to subjecting the wafers to plasma etching, (the plasma being generated by equipment containing an etch tunnel, as for example, shown in the references cited above). The plasma ambient used to etch titanium, tungsten, and silicon films consists of primarily carbon-tetra-fluoride ($CF_4$). The etch tunnel in the plasma etching equipment yields atomically neutral species of fluorine, which react with all of the above films, except the aluminum outer layer. Volatile compounds with fluorine are produced, and hence a pattern is etched in the films leaving behind the metal under the aluminum.

In the above prior art process, problems are encountered because of the aluminum/plasma interaction when narrow spacings (less than or equal to 2 mils) are to be etched. These problems are often encountered in various integrated circuits, high frequency transistors, and printed circuit board applications, because these devices may have quite narrow spacings. Etching of films then becomes incomplete in the narrow spacings. These incomplete etched films thus provide "bridging" interconnections between different metallic parts of the device, thereby creating short circuits and otherwise reducing or inhibiting performance of the device.

One of the prior art solutions was to attempt to complete the etchings in these narrow regions by overetching until the entire field becomes clear. However this prior art solution gives rise to additional problems as for example (1) undercutting of the pattern in the regions other than those with narrow spacings, and (2) creating shorts and leakages by overetching certain regions such as $n+$ cross under, and phosphorous doped glass in the emitter, thereby making them thinner than normal.

These are severe problems of the prior art process. Applicants have discovered and invented an improved process to fabricate a variety of integrated circuits and Schottky transistor devices, which improved process eliminates above-described severe shortcomings of the prior art process.

SUMMARY OF THE INVENTION

The present invention relates to an improved process for plasma etching a semiconductor water which has metallic layers deposited thereon. This process employs the following steps; (a) insulating a portion of the outermost of the metallic layers from etching effects of the plasma, which reduces interference by atomic effects of the outermost of these metallic layers with the plasma etching effects; (b) thereafter, subjecting the wafer to plasma etching effects and removing the wafer from the plasma after a predetermined etching result has been obtained; and (c) thereafter, removing insulation which had been applied, exposing the outermost of the layers along with the etching result which had been obtained.

In a further feature of the present invention, the process includes the step performed after above step (a) and prior to above step (b) of removing other than the insulated portion of the outermost layer of the metal films by subjecting the wafer to a photolithographic and chemical etching process to obtain a chemically-treated, photoresisted wafer, which then exposes the next otherwise contiguous metal layer surface not protected by the insulated portion.

In a yet further feature of the present invention, the outermost layer employed is selected from the metallic group consisting of gold, platinum, palladium and aluminum; the plasma is selected from the fluoride reagent group consisting of $C_3F_8$ and $CF_4$, the wafer is constructed of silicon and silicon dioxide with various diffused and metalized regions, and the insulation is photoresist.

It is thus an object of the present invention to provide an improved process for etching patterns in metal films.

It is a further object of the present invention to provide an improved process for etching a semiconductor wafer having metallic layers deposited thereon.

It is an even further object of the present invention to provide an improved process for fabricating metal semiconductor interfaces and interconnect patterns in metal films, particularly where the outermost layer is aluminum and the semiconductor is silicon covered in part with silicon dioxide.

It is an additional object of the present invention to provide an improved process for fabricating Schottky transistor devices and a variety of bipolar and MOS integrated circuits.

It is yet an additional object of the present invention to provide a plasma-etch process whereby the atomic effects of at least a portion of an outermost metallic layer of the device subjected to the plasma are insulated from the etching effects of the plasma.

Further objects and advantages of the present invention will be apparent after reference to the detailed description of preferred embodiments of the present invention and appended drawings wherein:

DESCRIPTION OF THE PREFERRED EMBODIMENTS

Figure 1:
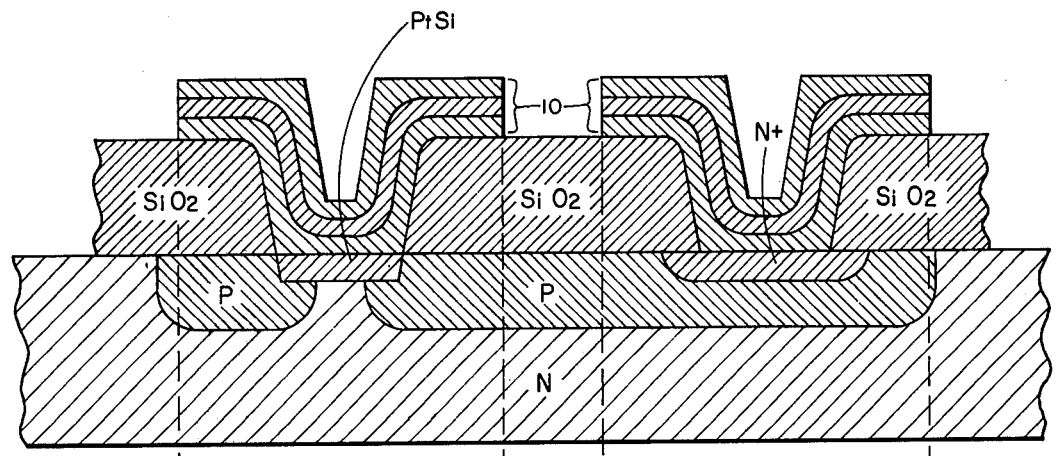
FIG. 1 is a cross-sectional view of a typical Schottky transistor semiconductor substrate used in integrated circuits.

Referring to FIG. 1, cross-section of a typical Schottky transistor substrate used in integrated circuits is shown. Various regions are identified as being either silicon dioxide ($SiO_2$), P-type semiconductor material (P), N-type semiconductor material (N), heavily doped N material (N+), platinum silicide (PtSi), etc. Reference numeral 10 is intended to depict a plurality of abutting metallic layers in cross-section. Dimensions "a", "b", "c", are depicted, the significance of which will be discussed later.

Figure 2:
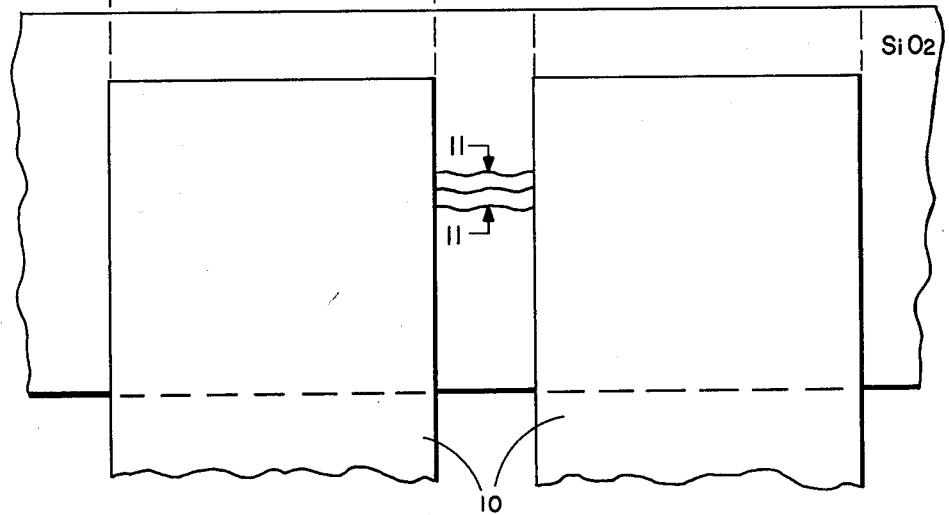
FIG. 2 is an undetailed top view of the semiconductor substrate shown in FIG. 1.

FIG. 2 shows essentially the same cross-section shown in FIG. 1, but from a top or plan view, without including some detail which would be shown in a true top view, for purposes of improving clarity of illustration of the present invention. Cross-sections of the plurality of metallic layers 10 are now shown as two rectangular shaped metallic "fingers" again designated by numeral 10. Also shown are metallic layer bridgings or remnants 11 which are indicated as connecting two fingers 10 in a short circuit mode. Again, dimensions "a", "b", "c", are shown.

Figure 3:
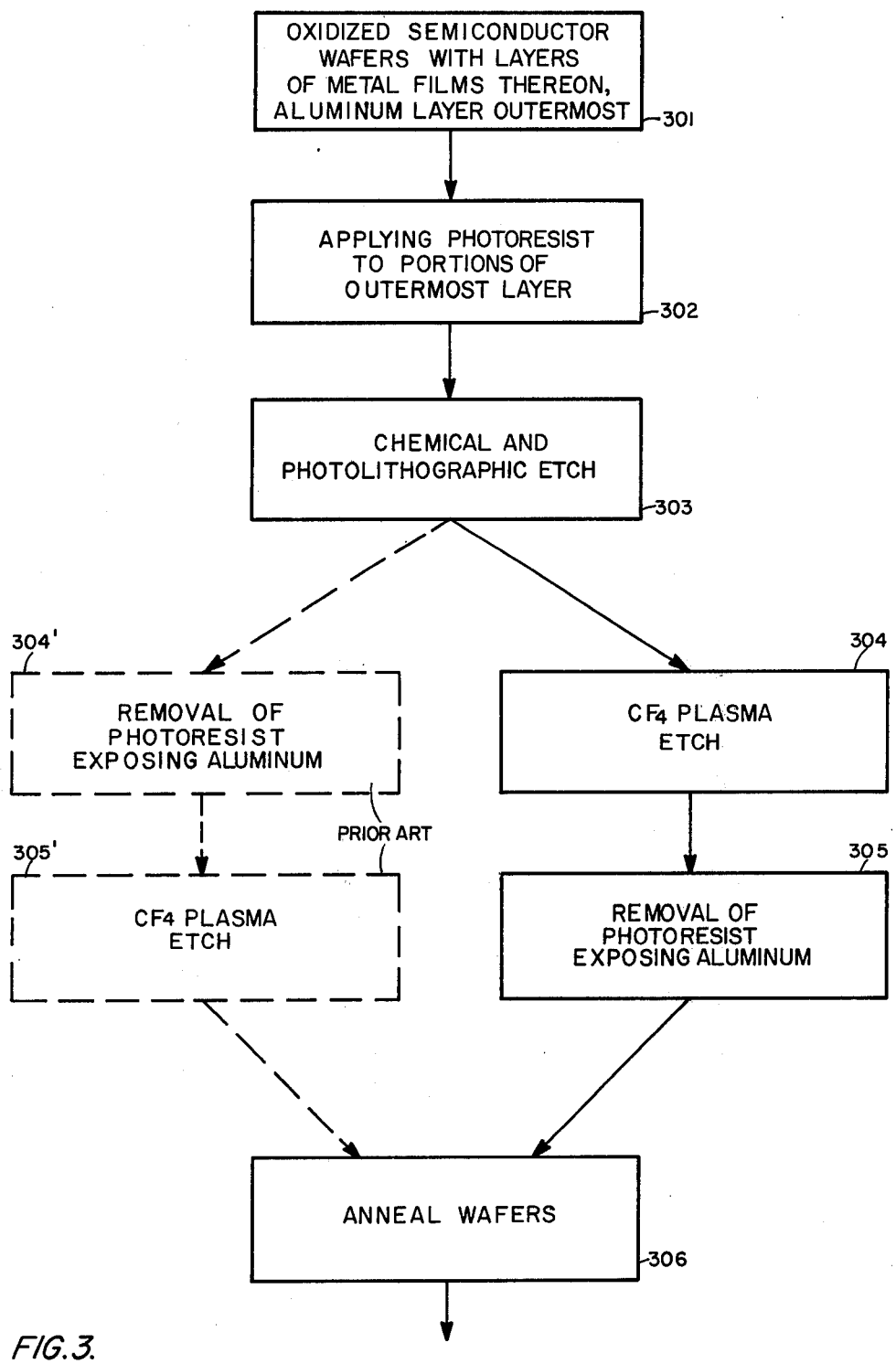
FIG. 3 is a schematic flow diagram incorporating the process of the present invention and comparing same with the process of the prior art.

Referring next to FIG. 3, schematic diagram of process flow is illustrated. Structure 301 produces an oxidized semiconductor wafer (or wafers) with layers of metal film deposited thereon, the outermost one of the layers being aluminum. (As noted other outermost metallic layers such as gold, platinum or palladium could be employed.) Structure 302 applies photoresist to certain chosen or selected or predetermined areas or portions on the exposed surface of the aluminum layer, obtaining thereby a photoresisted wafer having other than said predetermined or selected aluminum areas exposed.

Structure 303 provides removal of the exposed or unprotected areas of the aluminum layer (aluminum without photoresist thereon) by subjecting the photoresisted wafer to a photolithographic and chemical etching process, thereby obtaining a chemically treated photoresisted wafer. This exposes those "other than said selected" areas of the surface of the otherwise contiguous next metal layer, lying under the removed aluminum which had not been protected.

The prior art portion of the process is shown in dashed line construction in the left of FIG. 3. Structure 304' removes the photoresist from the surface and bares the outermost layer, the aluminum layer. Thereafter, in structure 305' the wafer having an exposed-aluminum outer layer is subjected to a $CF_4$ plasm etch. The resulting etched device is subject to all of the problems of the prior art as discussed earlier.

By contrast, structure 304 of the present invention provides a $CF_4$ plasma etch to the wafers obtained from structure 303 prior to removal of any photoresist insulation or protection. This critical step of the present invention thereby insulates the aluminum layer from the $CF_4$ plasma, but at the same time exposes the uninsulated and unprotected sub-layers of other metals to the etching effects of the plasma. After removing the wafer from structure 304 whereby a predetermined etching result has been obtained, the plasma etched wafer with photoresist thereon is introduced to structure 305 which removes the photoresist bareing the aluminum layer and the obtained etching result. Finally, the treated device is subjected to an annealing procedure in structure 306. The wafer obtained by way of the steps of the present invention are free from the shortcomings and problems of the prior art as discussed earlier. There are no bridgings or shorts between the metal fingers of the device.

A preferred set of process conditions includes: $CF_4$ plasma reagent with about 4% oxygen; R.F. power of about 150 watts; pressure of about 1.0 torr; duration of exposure of about 1 to 3 minutes depending upon wafer or device quantity and results desired.

With regard to actual equipment used, equipment of the type necessary to perform steps of the process as depicted in FIG. 3 is standard equipment in the industry. Details thereof need not be presented herein for full comprehension of the present invention. Descriptions of equipments 301 and 302 and their operations can be found in such references as: G. E. Moore in "Microelectronics", E. Keonjian Ed., The McGraw Hill Book Company, Inc., New York, (1963). Simlalarly, plasma etching equipment 304 is also commercially available and its operation can be described in incorporated by reference U.S. Pat. No. 3,879,597, entitled "Plasma Etching Device and Process". (A Plasma can be made by subjecting a gas at low pressure to radio frequency voltage. The etching itself is accomplished by placing the gas at low pressure in a quartz cylinder surrounded by a source of radio frequency power, such as a coil or a number of electrodes, and then energizing the coil or electrode high voltage at radio frequency. The production of a plasma is indicated by a bright glow within the quartz cylinder.)

Recapitulating, the present invention includes reversal of steps employed by the prior art process, wherein photoresist is left on top of the aluminum layer prior to the plasma etching. With this practice, whereby the aluminum is insulated from the etching effect of the plasma and atomic effects of both aluminum and plasma are isolated from each other, the following improvements are obtained. First, the entire pattern including narrow spacing "a" of FIGS. 1-2 is etched uniformly without generating any short circuit residual bridgings 11 thereon. Second, the etch rate of the film is greater than that which is obtained when the aluminum surface is not covered by photoresist. Third, phosphorus doped glass in the emitter, $n+$ cross-under, and other regions are not over-etched; hence, short and leaky junctions due to etchings are eliminated. And, finally, any problems otherwise encountered by attempting to remove plasma-treated photoresist is minimized, because the photoresist is not exposed to the plasma for a long time in any event. Whatever reaction there may be between the photoresist and the plasma does not create particularly troublesome effects, in terms of removing photoresist at the proper point in the process.

The dimensions "b" and "c" in FIG. 2 are larger than dimension "a". Dimensions "b" and "c" are dimensions of width of the metal fingers which are used in the construction of a Schottky transistor, and dimension "a" is distance between those two fingers. Particularly troublesome effects occur in the prior art when dimensions "b" and "c" are large compared to dimension "a". This combination of dimensions when employed on a device constructed in accordance with the principles of the prior art process generally results in the shorting problems discussed earlier in connection with the prior art process.

In the interest of completeness, a physical model to explain the foregoing positive results of the improvement is as follows: Aluminum is an electro-positive metal as compared to fluorine, which is the most electro-negative element. When the aluminum pattern is not covered with the photoresist film, and the exposed aluminum is subjected to the carbon-tetrafluoride plasma, aluminum atoms near its surface give up their electrons to the fluorine atoms in the plasma within the etch tunnel. In wide regions, this exchange of electrons is ineffective and fluorine atoms react with underlying films like tungsten to form volatile compounds. In these wide regions, clean etching therefore takes place.

But, in narrow regions, the exchange of electrons between aluminum and fluorine creates a space charge of negatively charged fluorine ions bound to the positively charged aluminum surface. Such a space charge would inhibit the etching of films like tunsten. Therefore residual tungsten bridgings do result. However, when the aluminum surface is covered with the photoresist film, such an electron exchange is prevented, and either no space charge is formed in the narrow regions or it is at least minimized. Thus with the aluminum pattern covered with the photoresist film, according to the principles and teachings of the present invention, uniform etching is obtained. Further, the etch rate is higher because the depletion of fluorine free radicals by aluminum is eliminated.

This invention can be embodied in other forms without departing from the spirit or essential characteristics thereof. The above invention is thus not to be limited to the specific combination of material discussed herein. Wide variety of metals and their alloys with differing chemical inertness and electronegativities can be used with this invention. Further, different types of grown or deposited insulator films can be used instead of photoresist films.

Therefore, the present embodiments are to be considered in all respects as illustrative and not restrictive, the scope of the invention being indicated by the appended claims rather than by the foregoing description, and all changes within the meaning and range of equivalency of the claims are therefore intended to be embraced therein.

What is claimed is:

1. An improved process for plasma etching of patterns in metal films, which process inhibits the build-up of space charge effects otherwise created by interactions between said plasma and the outermost one of said metal films, said process comprising the following steps in the order named:
   a. producing an oxidized semiconductor wafer with layers of said metal films deposited thereon, the outermost one of said layers being aluminum;
   b. applying photoresist to predetermined areas on the exposed surface of said aluminum layer to obtain a photoresisted wafer;
   c. removing other than said predetermined areas of said aluminum layer by subjecting said photoresisted wafer to a photolithographic and chemical etching process to obtain a chemically treated photoresisted wafer which exposes portions of the surface of the otherwise contiguous next metal layer lying directly beneath said other than said predetermined areas;
   d. subjecting said chemically treated photoresisted wafer to a $CF_4$ plasma to obtain a plasma-treated wafer from which said portions of the remaining of said layers of said metal films are removed thereby; and
   e. removing said photoresist to obtain said plasma treated wafer having an exposed aluminum surface.

2. The process of claim 1 and wherein said layers of metal are selected from the group consisting of aluminum, tungsten and titanium.

3. The process of claim 2 and wherein said oxidized semiconductor wafer comprises an oxidized silicon wafer.

4. The process of claim 1 and wherein said plasma subjecting step comprises: exposing said chemically treated photoresisted wafer to said $CF_4$ plasma with 4% oxygen under R.F. power of about 150 watts, at a pressure of about 1.0 torr, for a duration between 1 and 3 minutes.

5. A process for plasma etching a semiconductor wafer having metallic layers deposited thereon, which process inhibits the build-up of space charge effects otherwise created by interactions between said plasma and the outermost one of said metallic layers, said process comprising the steps of:
   a. first, insulating a portion of the outermost of said layers from etching effects of said plasma in order to reduce interference by atomic effects of said outermost of said layers with said etching effects;
   b. second, subjecting said wafer to said etching effects and removing said wafer therefrom after a predetermined etching result has been obtained; and
   c. third, removing insulation applied in said insulating step thereby exposing said portion of said outermost of said layers, along with said obtained etching result.

6. A process as recited in claim 5 and wherein said plasma is based on a reagent selected from the fluoride group consisting of $C_3F_8$ and $CF_4$, said semiconductor wafer is constructed of silicon and silicon dioxide with various diffused and metalized layers, said outermost of said layers is a metal selected from the group consisting of gold, platinum, palladium, and aluminum, and said insulation is photoresist.

7. A process as recited in claim 5 further including the step, performed after said first step and before said second step, of:
removing other than said insulated portion of the outermost of said layers thereby exposing some of the next otherwise contiguous one of said layers not protected by said insulated portion.

* * * * *